(12) United States Patent
Shin

(10) Patent No.: US 9,218,858 B2
(45) Date of Patent: Dec. 22, 2015

(54) DATA STORAGE DEVICE AND OPERATING METHOD THEREOF

(71) Applicant: SK hynix Inc., Gyeonggi-do (KR)

(72) Inventor: Ju Yong Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 136 days.

(21) Appl. No.: 14/144,050

(22) Filed: Dec. 30, 2013

(65) Prior Publication Data

US 2015/0138899 A1    May 21, 2015

(30) Foreign Application Priority Data

Nov. 15, 2013   (KR) .................. 10-2013-0139021

(51) Int. Cl.
*G11C 7/22*   (2006.01)
*G11C 7/00*   (2006.01)
*G06F 13/16*  (2006.01)
*G06F 12/02*  (2006.01)

(52) U.S. Cl.
CPC .............. *G11C 7/00* (2013.01); *G06F 13/1668* (2013.01); *G06F 12/0246* (2013.01)

(58) Field of Classification Search
CPC ........... G11C 11/5628; G11C 11/4096; G11C 11/5678; G11C 8/18; G11C 7/00; G11C 7/103; G11C 7/1051; G11C 7/1072; G11C 7/1078; G11C 7/1087
USPC ........... 365/185.03, 185.11, 189.05, 189.011, 365/189.08, 230.01, 238.5
See application file for complete search history.

(56) References Cited

U.S. PATENT DOCUMENTS

2014/0068203 A1*   3/2014   Son et al. ...................... 711/155

FOREIGN PATENT DOCUMENTS

KR    1020110116865    10/2011
KR    1020150003577    1/2015

* cited by examiner

*Primary Examiner* — Thong Q Le
(74) *Attorney, Agent, or Firm* — IP & T Group LLP

(57) ABSTRACT

An operating method of a data storage device may include performing a first write operation on a first memory region, and performing a second write operation on a second memory region to store position information on the first write operation.

20 Claims, 3 Drawing Sheets

: Partial page having no position information stored therein

DATA STORAGE DEVICE AND OPERATING METHOD THEREOF

CROSS-REFERENCES TO RELATED APPLICATION

The present application claims priority under 35 U.S.C. §119(a) to Korean application number 10-2013-0139021, filed on Nov. 15, 2013, in the Korean Intellectual Property Office, which is incorporated herein by reference in its entirety.

BACKGROUND

1. Technical Field

Various embodiments relate to a data storage device, and more particularly, to an operating method for enabling a data storage device to quickly start operation,

2. Related Art

A nonvolatile memory device may maintain data stored therein even though power is turned off. The nonvolatile memory device may include a flash memory device such as a NAND Flash or a NOR Flash, a ferroelectrics Random Access Memory (FRAM), a Phase-Change Random Access Memory (PRAM), a Magnetic Random Access Memory (MRAM), or a Resistive Random Access Memory (RRAM).

A data storage device including a nonvolatile memory device is being developed to perform a high-speed operation. Thus, there is a demand for operating methods for enabling a data storage device to quickly start operation, when power or interrupted power starts to be supplied to the data storage device.

SUMMARY

Various exemplary embodiments are directed to a data storage device capable of quickly resuming operation when interrupted power starts to be supplied and an operating method thereof.

In an exemplary embodiment of the present invention, an operating method of a data storage device may include performing a first write operation on a first memory region, and performing a second write operation on a second memory region to store position information on the first write operation.

In an exemplary embodiment of the present invention, a data storage device may include a first memory region, a second memory region, and a controller suitable for performing a first write operation on the first memory region and performing a second write operation on the second memory region to store position information on the first write operation.

BRIEF DESCRIPTION OF THE DRAWINGS

Features, aspects, and embodiments are described in conjunction with the attached drawings, in which.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used, The terms are used to describe the present invention, and are not used to qualify the sense or limit the scope of the present invention.

In this specification, 'and/or' represents that one or more of components arranged before and after 'and/or' are included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

Hereinafter, the exemplary embodiments of the present invention will be described with reference to the drawings.

Figure 1:
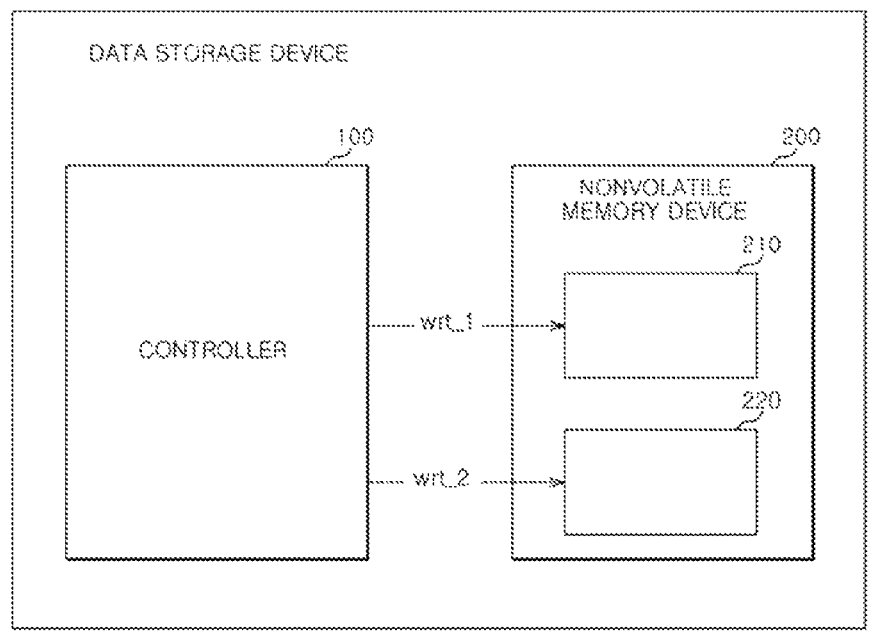
FIG. 1 is a block diagram illustrating a data storage device according to an embodiment of the present invention.

FIG. 1 is a block diagram illustrating a data storage device according to an embodiment of the present invention.

The data storage device 10 may store data provided from a host device (not illustrated) in response to a write request of the host device. Furthermore, the data storage device 10 may provide stored data to the host device in response to a read request of the host device.

The data storage device 10 may include a personal computer memory card international association (PCMCIA) card, a compact flash (CF) card, a smart media card, a memory stick, various multimedia cards (MMC, eMMC, RS-MMC, MMC-micro), a secure digital card (SD, Mini-SD, Micro-SD), a universal flash storage (UFS) device or a solid state drive.

The data storage device 10 may include a controller 100 and a nonvolatile memory device 200.

The controller 100 may control overall operations of the data storage device 10. For example, the controller 100 may control a write operation and a read operation for the nonvolatile memory device 200. In particular, the controller 100 may perform a first write operation wrt_1 on a normal region 210. The controller 100 may perform a second write operation wrt_2 on an anchor region 220 in order to store position information on the first write operation wrt_1. The controller 100 may perform the second write operation wrt_2 after, before, or while the first write operation wrt_1 is performed. In each case, the position information may include an address within the normal region 210, at which the first write operation wrt_1 was performed, will be performed, or is being performed.

The nonvolatile memory device 220 may include the normal region 210 and the anchor region 220. Each of the normal region 210 and the anchor region 220 may include a memory cell array having a plurality of memory cells. The memory cell may store one or more bit data.

The normal region 210 may store normal data, The normal data may include user data or various data used for operating its system. The anchor region 220 may store only position information on the first write operation wrt_1.

FIG. 1 illustrates that one nonvolatile memory device 200 is included in the data storage device 10. However, a plurality of nonvolatile memory devices may be included in the data storage device 10. In this case, each of the nonvolatile memory devices may include a normal region and an anchor region.

FIG. 1 illustrates that the normal region 210 and the anchor region 220 are included in one nonvolatile memory device 200. However, the normal region and the anchor region may be included in different nonvolatile memory devices, respectively.

Figure 2:
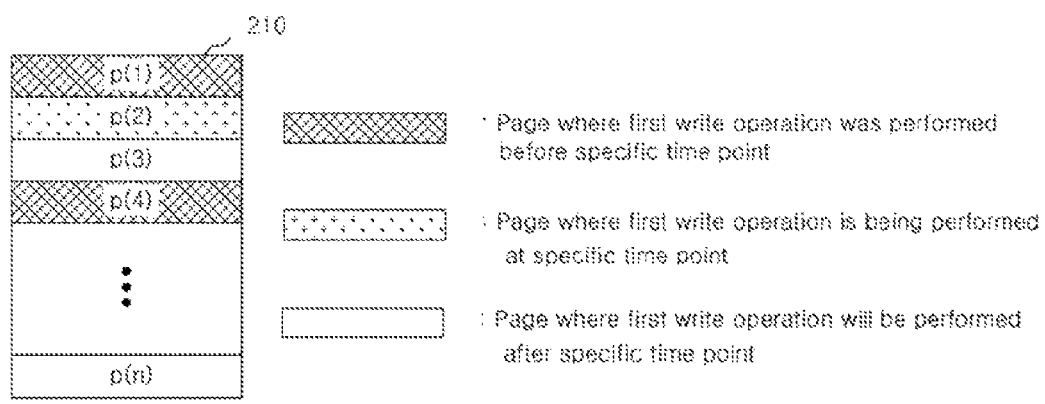
FIG. 2 is a diagram illustrating a normal region in which a first write operation is performed.
Figure 3:
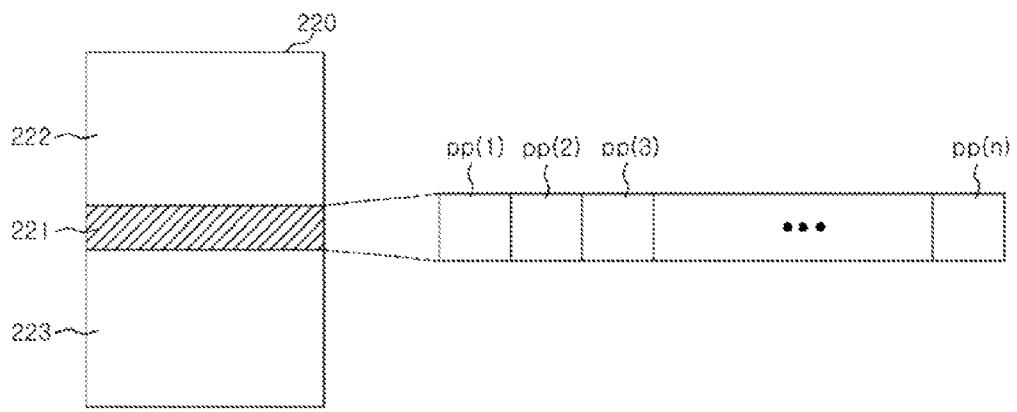
FIG. 3 is a diagram illustrating the configuration of the anchor region.
Figure 4:
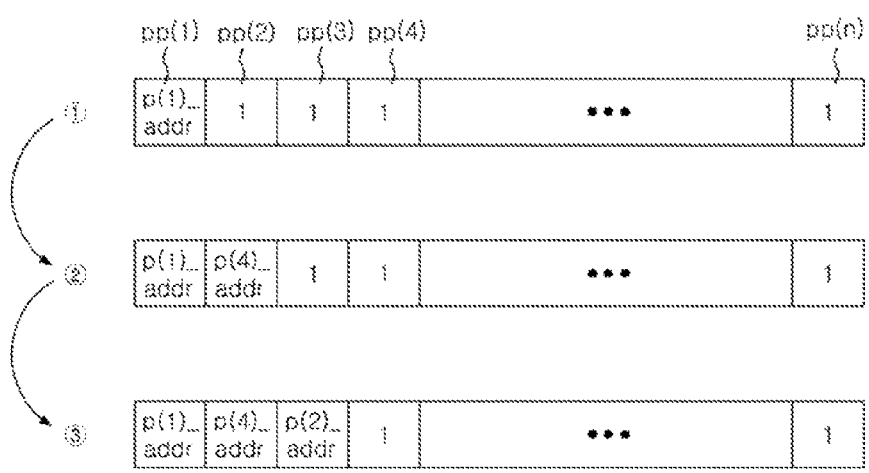
FIG. 4 is a diagram or explaining a method of performing a second write operation.
Figure 4:

In FIGS. 2 to 4, it is described as an example that the nonvolatile memory device 200 is a flash memory device, for simple description. When the nonvolatile memory device 200 is a flash memory device, the memory cell array of each of the normal region 210 and the anchor region 220 may include a plurality of pages. That is, it is described as an example for simple description that the nonvolatile memory device 200 operates on a page basis. Although the nonvolatile memory device is not configured by the page, the concept of the present invention may be applied as it is.

FIG. 2 is a diagram illustrating a normal region in which the first write operation is performed. FIG. 2 illustrates whether or not the first write operation wrt_1 is performed on each of a plurality of pages p(1) to p(n) included in the normal region 210 of FIG. 1.

The normal region 210 may store data through the first write operation wrt_1 which is performed by the page (on a page basis). The first write operation wrt_1 may be performed on the plurality of pages p(1) to p(n) in a preset write sequence. The preset write sequence may correspond to the sequence of the pages p(1) to p(n) to be written. For example, the preset write sequence may correspond to the sequence from the first page p(1) to the n-th page p(n). For another example, the preset write sequence may correspond to a random sequence.

Referring to FIG. 2, the first write operation wrt_1 may be performed on the first page p(1) and the fourth page p(4) before a specific time point. Furthermore, the first write operation wrt_1 may be performed on the second page p(2) at the specific time point. Furthermore, the first write operation wrt_1 may be performed on the third page p(3) and other pages after the specific time point.

Position information may be stored for each of the first write operations wrt_1. The position information may have a different meaning depending on the time point at which the position information is stored, that is, the time point at which the second write operation wrt_1 is performed.

First, when the position information is stored after the first write operation wrt_1 is performed, the position information may include an address of a page at which the first write operation wrt_1 was performed. That is, after the first write operation wrt_1 for the first page p(1) is performed, an address of the first page p(1) may be stored as position information. Furthermore, after the first write operation wrt_1 for the fourth page p(4) is performed, an address of the fourth page p(4) may be stored as position information. After the specific time point, an address of the second page p(2) may be stored as position information after the first write operation wrt_1 for the second page p(2) is performed.

Second, when position information is stored prior to the first write operation wrt_1 is to be performed, the position information may include an address of a page, at which the first write operation wrt_1 will be performed. That is, before the first write operation for the first page p(1), an address of the first page p(1) may be stored as position information. Furthermore, before the first write operation wrt_1 for the fourth page p(4), an address of the fourth page p(4) may be stored as position information. Furthermore, before the first write operation wrt_1 for the second page p(2), an address of the second page p(2) may be stored as position information. After the specific time point, an address of the third page p(3) may be stored as position information before the first write operation wrt_1 for the third page p(3).

Third, when position information is stored while the first write operation wrt_1 is performed, the, position information may include an address of a page at which the first write operation wrt_1 is being performed. That is, when the first write operation wrt_1 for the first page p(1) is being performed, an address of the first page p(1) may be stored as the position information. Furthermore, when the first write operation wrt_1 for the fourth page p(4) is being performed, an address of the fourth page p(4) may be stored as the position information. At the specific time point, an address of the second page p(2) may be stored as the position information while the first write operation wrt_1 for the second page p(2) is being performed.

FIG. 3 is a diagram illustrating the configuration of the anchor region.

The anchor region 220 may include one block having a plurality of pages. In this case, the anchor region 220 may include a designated page 221, at which the position information for the first write operation wrt_1 is to be stored, and discarded regions 222 and 223.

A bad block may be used as the anchor region 220. The bad block may include a defective block which has a defect caused during a fabrication process or when the data storage device is used. Since the bad block is not suitable for storing data the bad block may be managed separately so as not to be used to store data. However, although any block is determined to be a bad block, the corresponding bad block may include any one page which has no problem in data reliability. In this case, the corresponding bad block may be set as the anchor region 220, and the corresponding page may be set as the designated page 221.

However, it is not only a bad block, which is set as the anchor region 220. That is, a normal block may be set as the anchor region 220, instead of a bad block.

The controller 100 of FIG. 1 may perform the second write operation wrt_2 to store position information in a specific partial page among a plurality of partial pages pp(1) to pp(n) included in the designated page 221. The controller 100 may perform the second write operation wrt_2 on the designated page 221 by the number of partial pages pp(1) to pp(n), for example, several hundred times or more.

As will be described below, only the latest position information, which has been most recently stored, has a significant meaning. Thus, when the second write operation wrt_2 is performed to store position information only in a specific partial page, data damage caused by interference or interruption between cells may not be considered.

The discarded regions 222 and 223 may not be used to store data. In particular, when any bad block is set as the anchor region 220, regions 222 and 223 other than the designated page 221 may be set as discarded regions in a manner similar to before the block is set as the anchor region 220.

FIG. 4 is a diagram for explaining a method of performing the second write operation. In FIG. 4, it is described as an example that position information is stored after the first write operation wrt_1 of FIG. 1 is performed. That is, the position information may include an address of a page at which the first write operation wrt_1 was performed FIG. 4 illustrates a process in which position information is stored in the designated page 221 through the second write operation wrt_2 of FIG. 1. FIG. 4 illustrates data ① and ② stored in the designated page 221 before the specific time point described in FIG. 2 and data ③ stored in the designated page 221 after the specific time point.

In FIG. 4, it is described as an example that, when a read operation for the designated page 221 is performed, data stored in the first partial page pp(1), data stored in the second partial page pp(2), data stored in the third partial page pp(3), . . . , data stored in the n-th partial page pp(n) are sequentially outputted.

The controller 100 of FIG. 1 may perform the second write operation wrt_2 for the partial pages pp(1) to pp(n) in a preset write sequence, that is the sequence at which the partial pages pp(1) to pp(n) are written. In other words, the controller 100 may store position information in a partial page next to the partial pages in which position information has been stored, based on the preset write sequence. For example, the write sequence may be set in order of the first partial page pp(1), the second partial page pp(2), the third partial page pp(3), . . . , the n-th partial page pp(n). FIG. 4 illustrates such a case.

Referring to FIG. 4, after the first write operation wrt_1 is performed on the first page p(1) of the normal region before a specific time point, the controller 100 may perform the second write operation wrt_2 on the first partial page pp(1) to store an address p(1)_addr of the first page p(1) (①). Furthermore, after the first write operation wrt_1 is performed on the fourth page p(4), the controller 100 may perform the second write operation wrt_2 on the second partial page pp(2) to store an address p(4)_addr of the fourth page p(4) (②). After the first write operation wrt_1 is performed on the second page p(2) after the specific time point, the controller 100 may perform the second write operation wrt_2 on the third partial page pp(3) to store an address p(2)_addr of the second page (③).

When the controller 100 performed the second write operation wrt_2 up to a specific partial page in the write sequence, the other partial pages may not store position information. That is, the other partial pages may exist in an erase state. For example, '1' may be successively stored in the other partial pages. For example, when the controller 100 performed the second write operation wrt_2 up to the third partial page pp(3) (③), the fourth partial page pp(4) to the n-th partial page pp(n) may successively store '1'. Thus, when the stored position information is needed, the controller 100 may perform a read operation on the designated page 221, and acquire data, which is outputted immediately before successive '1's, as the latest position information.

For another example, the write sequence may be set in reverse order to the sequence described with reference to FIG. 4. That is, the write sequence may be set in order of the n-th partial page pp(n), . . . , the third partial page pp(3), the second partial page pp(2), and the first partial page pp(1). In this case, when the stored position information is needed, the controller 100 may acquire data, which is outputted immediately after successive '1's, as the latest position information.

Figure 5:
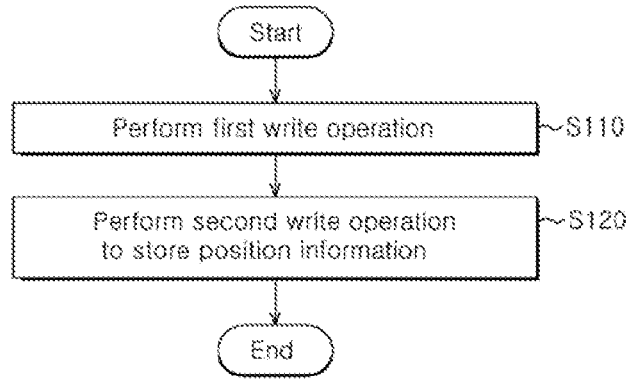
FIG. 5 is a flowchart for explaining a first operating method of the data storage device according to the embodiment of the present invention.

FIG. 5 is a flowchart for explaining a first operating method of the data storage device according to the embodiment of the present invention.

At step S110, the controller 100 of FIG. 1 may perform the first write operation wrt_1 on the normal region 210.

At step S120, the controller 100 may perform the second write operation wrt_2 on the anchor region 220, in order to store position information on the first write operation wrt_1. The position information may include an address within the normal area 210, at which the first write operation wrt_1 was performed.

Figure 6:
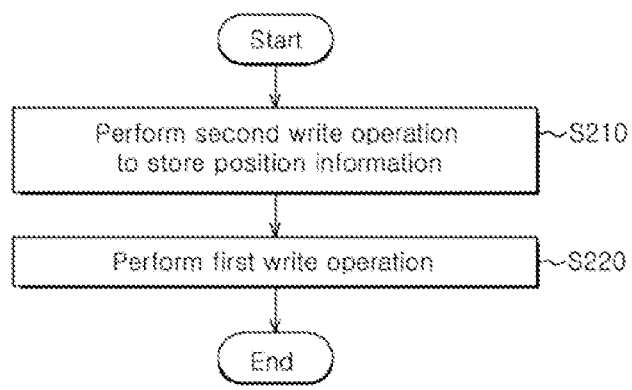
FIG. 6 is a flowchart for explaining a second operating method of the data storage device according to the embodiment of the present invention.

FIG. 6 is a flowchart for explaining a second operating method of the data storage device according to the embodiment of the present invention.

At step 5210, the controller 100 may perform the second write operation wrt_2 on the anchor region 220 to store position information on the first write operation wrt_1. At this time, the position information may include an address within the normal region 210 at which the first write operation wrt_1 will be performed.

At step S220, the controller 100 may perform the first write operation wrt_1 on the normal region 210.

Figure 7:
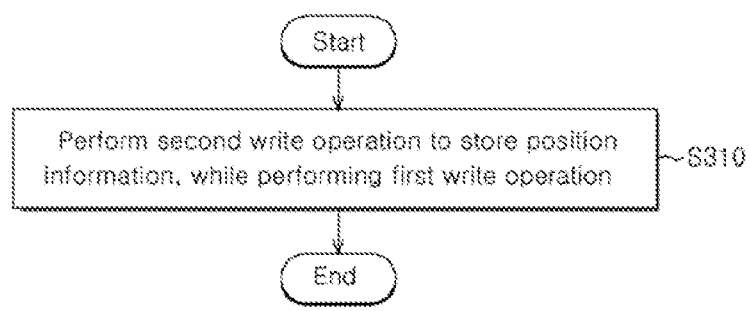
FIG. 7 is a flowchart for explaining a third operating method of the data storage device according to the embodiment of the present invention.

FIG. 7 is a flowchart for explaining a third operating method of the data storage device according to the embodiment of the present invention.

At step S310, the controller 100 may perform the second write operation wrt_2 on the anchor region 220 to store position information on the first write operation wrt_1, while performing the first write operation wrt_1 on the normal region 210. At this time, the position information may include an address of the normal region 210 at which the first write operation wrt_1 is being performed.

The operating method of FIG. 7 may be performed when the normal region 210 and the anchor region 220 are included in different nonvolatile memory devices, or when each of a plurality of nonvolatile memory devices includes the normal region 210 and the anchor region 220.

The operating methods described with reference to FIGS. 5 to 7 are different from each other in the sequence where the first write operation wrt_1 and the second write operation wrt_2 are performed. According to the operating method of FIG. 5, the controller 100 may perform the second write operation wrt_2 to store the position information, after performing the first write operation wrt_1. According to the operating method of FIG. 6, the controller 100 may perform the second write operation wrt_2 to store position information, before performing the first write operation wrt_1. According to the operating method of FIG. 7, the controller 100 may perform the second write operation wrt_2 to store position information, while performing the first write operation wrt_1.

The controller 100 may use the stored position information, when interrupted power starts to be supplied. For example, the controller 100 may use the stored position information when a sudden power-off occurs and power is then resupplied. That is, since the latest position information among the stored pieces of position information corresponds to an address within the normal region 210 at which the first write operation wrt_1 was performed when or immediately before the sudden power-off occurs, the controller 100 may quickly resume the first write operation wrt_1.

For another example, the controller 100 may use the stored position information when a normal power-off occurs and power is then resupplied. The controller 100 may back up various driving data used for driving the data storage device 10 before the normal power-off. The controller 100 may perform the first write operation wrt_1 to back up various driving data, and store position information on the first write operation wrt_1. The controller 100 may quickly load the driving data through the stored position information, when power is resupplied.

While certain embodiments have been described above, it will be understood to those skilled in the art that the embodiments described are by way of example only. Accordingly, the data storage device described herein should not be limited based on the described embodiments. Rather, the data storage device described herein should only be limited in light of the claims that follow.

What is claimed is:

1. An operating method of a data storage device, comprising:
performing a first write operation on each of a plurality of pages included in a first memory region; and
performing a second write operation on at least one designated page included in a second memory region to store position information on the first write operation,
wherein the second memory region further includes a plurality of discarded pages, and
wherein the plurality of discarded pages are prohibited from being accessed.

2. The operating method according to claim 1, wherein the designated page includes a plurality of partial pages, and
wherein the second write operation is performed on each of the plurality of partial pages.

3. The operating method according to claim 2, wherein the second write operation is sequentially performed on the plurality of partial pages included in the designated page.

4. The operating method according to claim 1, wherein the position information comprises an address of a page of the plurality of pages at which the first write operation is performed.

5. The operating method according to claim 1, wherein when the performing of the first write operation is interrupted, the performing of the first write operation resumes based on the position information.

6. A data storage device comprising:
a first memory region including a plurality of pages;
a second memory region including at least one designated page and a plurality of discarded pages; and
a controller suitable for performing a first write operation on each of the plurality of pages and performing a second write operation on the designated page to store position information on the first write operation,
wherein the plurality of discarded pages are prohibited from being accessed.

7. The data storage device according to claim 6, wherein the designated page includes a plurality of partial pages, and
the controller performs the second write operation on each of the plurality of partial pages.

8. The data storage device according to claim 7, wherein the controller performs the second write operation sequentially on the plurality of partial pages included in the designated page.

9. The data storage device according to claim 7, wherein partial pages other than at least one partial page having position information stored therein, among the plurality of partial pages, exist in an erase state.

10. The data storage device according to claim 6, wherein the position information comprises an address of a page of the plurality of pages at which the first write operation is performed.

11. The data storage device according to claim 6, wherein the second memory region is a memory block which is managed as a bad block.

12. The data storage device according to claim 6, wherein the controller determines whether the first write operation has been interrupted by a sudden power-off and resumes an interrupted first write operation based on position information lastly stored in the designated page.

13. The data storage device according to claim 6, wherein the controller backs driving data up on the first memory region through the first write operation and loads the driving data from the first memory region based on position information lastly stored in the designated page when performing a boot operation.

14. The data storage device according to claim 6, wherein the controller performs a read operation on the designated page to acquire read data from the designated page and acquires data adjacent to a sequence of erase data in the read data as position information lastly stored in the designated page.

15. The data storage device according to claim 6, wherein the controller performs the second write operation after performing the first write operation.

16. The data storage device according to claim 6, wherein the controller performs the second write operation prior to performing the first write operation.

17. The data storage device according to claim 15, wherein the controller performs the write operation sequentially on the plurality of partial pages.

18. The data storage device according to claim 15, wherein when first data is stored in a first partial page, second data stored in at least one second partial page preceding the first partial page is disregarded.

19. The data storage device according to claim 15, wherein the memory region is a memory block which is managed as a bad block.

20. A data storage device comprising:
nonvolatile memory device including a memory region, the memory region including at least one designated page and a plurality of discarded pages, the designated page including a plurality of partial pages; and
a controller suitable for performing a write operation on each of the plurality of partial pages,
wherein the discarded pages are prohibited from being accessed.

* * * * *